United States Patent
Roy

(10) Patent No.: US 8,053,353 B2
(45) Date of Patent: Nov. 8, 2011

(54) METHOD OF MAKING CONNECTIONS IN A BACK-LIT CIRCUIT

(75) Inventor: François Roy, Seyssins (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 217 days.

(21) Appl. No.: 12/431,439

(22) Filed: Apr. 28, 2009

(65) Prior Publication Data

US 2009/0309232 A1    Dec. 17, 2009

(30) Foreign Application Priority Data

Apr. 30, 2008    (FR) ..................................... 08 52950

(51) Int. Cl.
*H01L 21/4763* (2006.01)

(52) U.S. Cl. ........ 438/622; 438/612; 438/614; 438/629; 438/637; 438/639; 257/774; 257/758; 257/204

(58) Field of Classification Search .................. 438/637, 438/638, 639, 640, 668, 612, 613, 614, 622, 438/623; 257/773, 774, 758, 204, 274, 784, 257/786, 779, 734, 780, 781
See application file for complete search history.

(56) References Cited

U.S. PATENT DOCUMENTS

| | | | | |
|---|---|---|---|---|
| 5,739,587 | A * | 4/1998 | Sato ............................... | 257/758 |
| 6,656,828 | B1 * | 12/2003 | Maitani et al. ................ | 438/613 |
| 7,285,477 | B1 | 10/2007 | Bernstein et al. | |
| 7,391,114 | B2 * | 6/2008 | Mimura et al. ............... | 257/758 |
| 7,679,180 | B2 * | 3/2010 | Tsao et al. .................... | 257/700 |
| 7,863,705 | B2 * | 1/2011 | Yamazaki ..................... | 257/459 |
| 2001/0026001 | A1 | 10/2001 | Yagi | |
| 2005/0104148 | A1 | 5/2005 | Yamamoto et al. | |
| 2006/0033168 | A1 | 2/2006 | Umemoto et al. | |
| 2006/0183265 | A1 * | 8/2006 | Oh et al. ....................... | 438/65 |
| 2008/0246152 | A1 * | 10/2008 | Liu et al. ...................... | 257/758 |
| 2010/0314776 | A1 * | 12/2010 | Blanchard ..................... | 257/774 |

FOREIGN PATENT DOCUMENTS

| | | |
|---|---|---|
| FR | 2 910 705 A1 | 6/2008 |
| JP | 06275803 A | 9/1994 |
| JP | 2005191492 A | 7/2005 |
| WO | WO 2008074691 A | 6/2008 |

OTHER PUBLICATIONS

French Search Report dated Jan. 26, 2009, from corresponding French Application No. 08/52950, filed Apr. 30, 2008.

* cited by examiner

*Primary Examiner* — Ha Tran T Nguyen
*Assistant Examiner* — Thanh Y Tran
(74) *Attorney, Agent, or Firm* — Lisa K. Jorgenson; James H. Morris; Wolf, Greenfield & Sacks, P.C.

(57) ABSTRACT

A method for forming, on a surface of a thinned-down semiconductor substrate, a contact connected to a metal track of an interconnect stack formed on the opposite surface of the thinned-down substrate, including the steps of: forming, on the side of a first surface of a substrate, an insulating region penetrating into the substrate and coated with a conductive region and with an insulating layer crossed by conductive vias, the vias connecting a metal track of the interconnect stack to the conductive region; gluing the external surface of the interconnect stack on a support and thinning down the substrate; etching the external surface of the thinned-down substrate and stopping on the insulating region; etching the insulating region and stopping on the conductive region; and filling the etched opening with a metal.

24 Claims, 3 Drawing Sheets

METHOD OF MAKING CONNECTIONS IN A BACK-LIT CIRCUIT

CROSS REFERENCE TO RELATED APPLICATIONS

This application claims the priority benefit of French patent application number 08/52950, filed on Apr. 30, 2008, entitled "METHOD OF MAKING CONNECTIONS IN A BACK-LIT CIRCUIT," which is hereby incorporated by reference to the maximum extent allowable by law.

BACKGROUND OF THE INVENTION

1. Field of the Invention

The present invention relates to back-lit image sensors and, more specifically, to a method for establishing a contact, from the rear surface, with a metal track formed on the front surface of a back-lit image capture device.

2. Discussion of the Related Art

In back-lit image sensors, photodiodes and transfer transistors are formed on the front surface of a substrate and an interconnect stack comprising many vias and metal track levels is formed on the front surface of the substrate to connected the photodetection elements together in adapted fashion. A support is attached to the interconnect stack and the substrate is thinned down to enable a lighting of the photodiodes from the rear surface, through the thinned-down substrate.

To connect a metal track formed in the interconnect stack to an element external to the circuit, it is generally provided to contact the metal track from the rear surface of the circuit, through the thinned-down substrate and next to the photodetection areas. Indeed, it would be difficult to contact the front surface of the device due to the thickness of the support on which the interconnect stack is attached.

Many methods have been suggested to contact a metal track present in the interconnect stack from the rear surface of the circuit. However, these methods have several disadvantages. First, they generally provide a succession of several etch steps, which necessitates the forming of several masks. The implementation of such methods is thus relatively long. Further, some at least of the known methods imply the stopping of at least one of the etchings directly on the metal layer of the interconnect stack which is closest to the substrate, which poses problems of corrosion of the material forming this track.

SUMMARY OF THE INVENTION

There thus is a need for a relatively simple method for establishing a contact, from the rear surface, with an interconnect track formed on the front surface side of a device comprising back-lit image sensors, where this method does not cause the corrosion of the metal track on which the contact is made.

Thus, an embodiment of the present invention provides a method for forming, on a surface of a thinned-down semiconductor substrate, a contact connected to a metal track of an interconnect stack formed on the opposite surface of the thinned-down substrate, comprising the steps of: forming, on the side of a first surface of a semiconductor substrate, an insulating region penetrating into the substrate and coated with a conductive region and with an insulating layer crossed by conductive vias, said vias connecting a metal track of the interconnect stack to said conductive region, said conductive region being formed at the same time as gates of MOS transistors; gluing the external surface of the interconnect stack on a support and thinning down the substrate; and etching the external surface of the thinned-down substrate and stopping on said insulating region; etching said insulating region and stopping on said conductive region; and filling the etched opening with a metal.

According to an embodiment, the method further comprises a method for forming photodetection elements associated with the MOS transistors, on the side of the first surface of the semiconductor substrate, said photodetection elements being intended to be lit from the external surface of the thinned-down substrate.

According to an embodiment, the insulating region is formed at the same time as insulation trenches formed around the photodetection elements.

According to an embodiment, the conductive vias are formed at the same time as second conductive vias contacting the gates of the MOS transistors.

According to an embodiment, the method further comprises a step of forming a protection layer between the step of etching the external surface of the thinned-down substrate and the step of etching the insulating region.

According to an embodiment, the protection layer is made of silicon oxide, of silicon nitride, of silicon oxynitride, or is formed of a multiple-layer silicon oxide—silicon nitride—silicon oxide stack.

According to an embodiment, the filling of the etched opening with metal comprises a step of metal deposition on the structure and a step of polishing of the structure enabling to remove the metal which is not in the opening.

Another embodiment of the present invention provides a contact structure connecting a first surface of a thinned-down semiconductor substrate to a metal track of an interconnect stack formed on the side of the second surface of the thinned-down substrate, comprising: a metal region crossing the substrate; a conductive region extending over the second surface of the substrate, in contact with the metal region, said conductive region having the same structure as gates of MOS transistor formed on the second surface of the substrate; a dielectric material layer formed between the conductive region and the metal track; and conductive vias crossing the dielectric material layer and connecting the metal track to the conductive region.

The foregoing objects, features, and advantages of the present invention will be discussed in detail in the following non-limiting description of specific embodiments in connection with the accompanying drawings.

DETAILED DESCRIPTION

Figure 1:
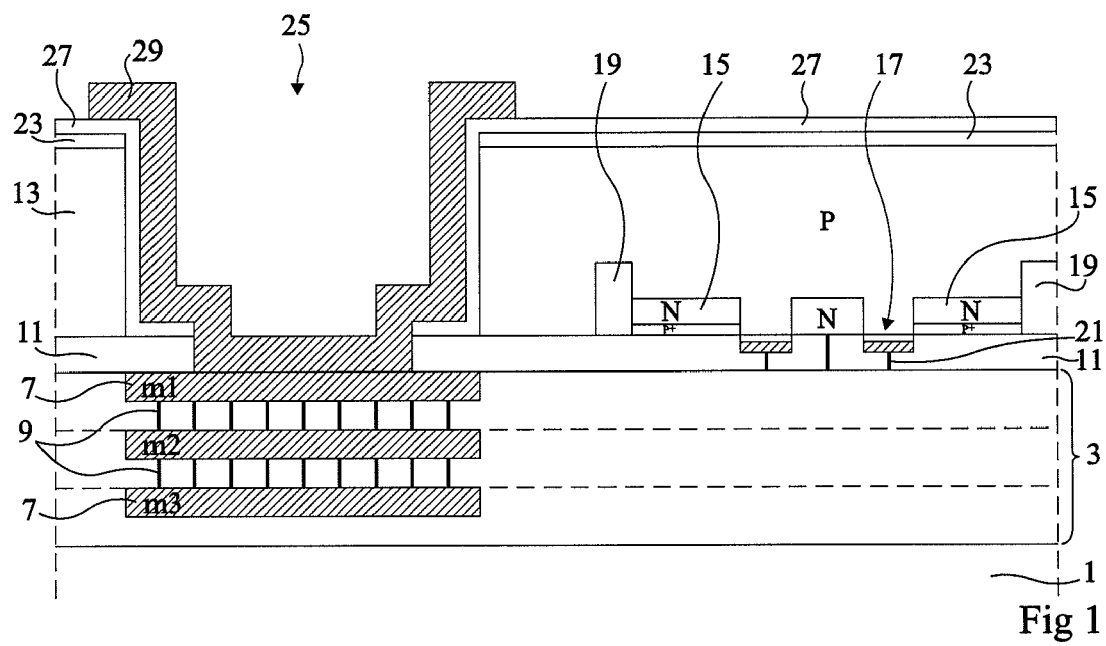
FIG. 1 illustrates, in cross-section view, a structure of contact, from the rear surface, on a metal track formed on the front surface of a back-lit circuit.

For clarity, the same elements have been designated with the same reference numerals in the different drawings and, further, as usual in the representation of integrated circuits, the various cross-section views have not been drawn to scale.

FIG. 1 is a cross-section view of a contact structure, from the rear surface, on a metal track formed on the front surface of a back-lit circuit.

An interconnect stack 3 which is formed of many interconnect levels rests on a semiconductor support 1. For simplification, only three interconnect levels in which metal tracks 7 (m1, m2, and m3) separated by a dielectric material are formed have been shown. Metal vias 9 enable to connect metal tracks 7 together in adapted fashion. In FIG. 1, only portions of metal tracks formed at the level of the contact are shown.

A layer of a dielectric material 11 supporting a thin semiconductor substrate 13 extends on interconnect stack 3. In and on thin substrate 13, on the side of interconnect stack 3, are formed photodiodes 15, charge transfer transistors 17, and other active or passive elements conventionally present in image sensors. To isolate some of these elements and avoid crosstalk and eddy current problems, isolation trenches 19 are formed in thin substrate 13. Metal vias 21 formed in layer 11 enable to connect the different elements of the image sensor together and to external terminals via the metal tracks formed in interconnect stack 3. An insulating layer 23 extends on thin substrate 13 on the rear surface side of the structure. It should be understood that various lens and/or color filter structures (not shown) may be provided on this rear surface in front of the various image sensor pixels.

An opening 25 crosses insulating layer 23, thin substrate 13, and dielectric material layer 11 and stops on a metal track m1 formed in the first interconnect level. A thin protection layer 27 aiming at isolating thin substrate 13 from the metal formed in opening 25 extends on the walls of opening 25 and on top of layers 11 and 23. An aluminum layer 29 is formed in contact with metal track m1 and on the walls of opening 25, that is, on thin layer 27.

To obtain the structure of FIG. 1, insulating layer 23 and thin substrate 13 are first etched to form an opening in this stack at the desired contact location. This etching is provided to stop on dielectric material layer 11. Protection layer 27 is then deposited on the walls and the bottom of the opening and also above insulating layer 23.

Then, a second etching is performed to etch, in a portion of the bottom of the first opening, insulating layers 27 and 11. This second etching stops on metal track m1. Then, an aluminum layer is deposited over the entire structure and this layer is etched to remove the aluminum formed above the image capture elements. A wire, or any adapted connection element, is then connected to metal 29.

Thus, the method for forming the structure of FIG. 1 comprises three successive etchings, and one of them stops on metal track m1. As seen previously, this poses problems of corrosion of the material forming this metal track. Such corrosion problems are particularly critical in the case where track m1 is made of copper.

Further, the structure of FIG. 1 has the disadvantage of having a non-planar upper surface. This is a problem in subsequent steps of the image sensor forming. For example, it may be desired to form color filters above the detection regions of the image sensor, on the rear surface side of substrate 13. These filters are formed by depositing a colored resin over the entire structure, and by then etching this resin in adapted fashion. During the deposition, opening 25 is filled with resin and it is difficult to totally remove this resin by etching. The electric connection on aluminum layer 29 then risks being of poor quality.

Thus, the applicant provides a method for establishing a contact, from the rear surface, with a metal track formed on the front surface of a back-lit device, this method avoiding problems of corrosion of the metal track and providing a structure with a planar upper surface.

FIGS. 2A to 2H are cross-section views illustrating successive steps of an embodiment of a method for forming such a contact.

Figure 2A:
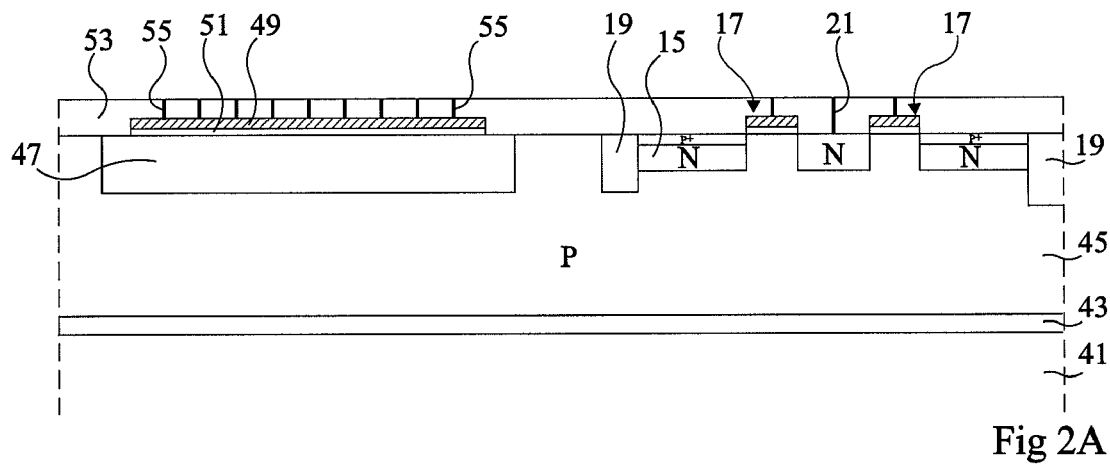
FIGS. 2A to 2H are cross-section views illustrating results of steps of a method according to an embodiment of the present invention for establishing a contact, from the rear surface, with a metal track formed on the front surface of a back-lit circuit.

At the step illustrated in FIG. 2A, it is started from a structure comprising a semiconductor support 41 supporting a thin layer of insulating material 43, itself topped with a semiconductor layer 45 which will be called substrate herein. As an example, substrate 45 may have a thickness ranging between 2 and 4 µm. This structure may be formed by any known method for forming a semiconductor layer on an insulating layer, for example, by any method known as SOI (Silicon on Insulator). Insulating layer 43 has a thickness ranging between 100 and 200 nm, for example, 150 nm. As a variation, substrate 45 may be formed of the upper portion of a semiconductor wafer of significant thickness, with no interposed insulating layer.

Photodiodes 15 are formed in substrate 45 in the region of the structure intended for the photodetection. As a non-limiting example, and as shown in FIG. 2A, photodiodes 15 may be "pinned photodiodes". Charge transfer transistors 17 are also conventionally formed in and on semiconductor substrate 45. Insulation trenches 19 are formed in substrate 45 around the photodetection regions.

It should be understood that other passive or active elements may be formed in the photodetection region and that the elements shown in FIG. 1 are only an illustration. Further, since the forming of these different elements is known by those skilled in the art, it will not be described in further detail herein.

In the region of the structure in which the contact is desired to be formed (to the left in FIG. 2A), an insulating region 47 is formed in substrate 45, at the surface thereof. Insulating region 47 is formed over the entire surface of substrate 45 at the level of which a contact is desired to be taken (although a single contact has been shown, several contacts are generally simultaneously formed). Region 47 will, for example, be made of silicon oxide and may be formed by a shallow trench insulation forming method (STI). It may have a depth ranging between 0.2 and 0.5 µm and it may be formed at the same time as insulation trenches 19.

A conductive region 49 is formed above insulating region 47, on substrate 45. This conductive region is formed at the same time as the gates of transfer transistors 17 formed in the photodetection region. Conductive region 49 extends almost over the entire region 47 and it is conventionally formed of a doped polysilicon layer which rests on a thin insulating layer 51, for example, silicon oxide, having a thickness of some ten nanometers.

A layer 53 of a dielectric material is formed above this structure. Conductive vias 21 are formed in this layer above the components of the detection region to connect these components together in adapted fashion. Conductive vias 55 are also formed above conductive region 49. Many conductive vias 55 are formed over the entire surface of this conductive region.

It should be noted that the different portions formed in the contact region (conductive region 49 and insulating region 47) are advantageously formed at the same time as elements of the photodetection region. Thus, to obtain the structure of FIG. 2A, no additional step is to be provided with respect to conventional sensor manufacturing methods.

Figure 2B:
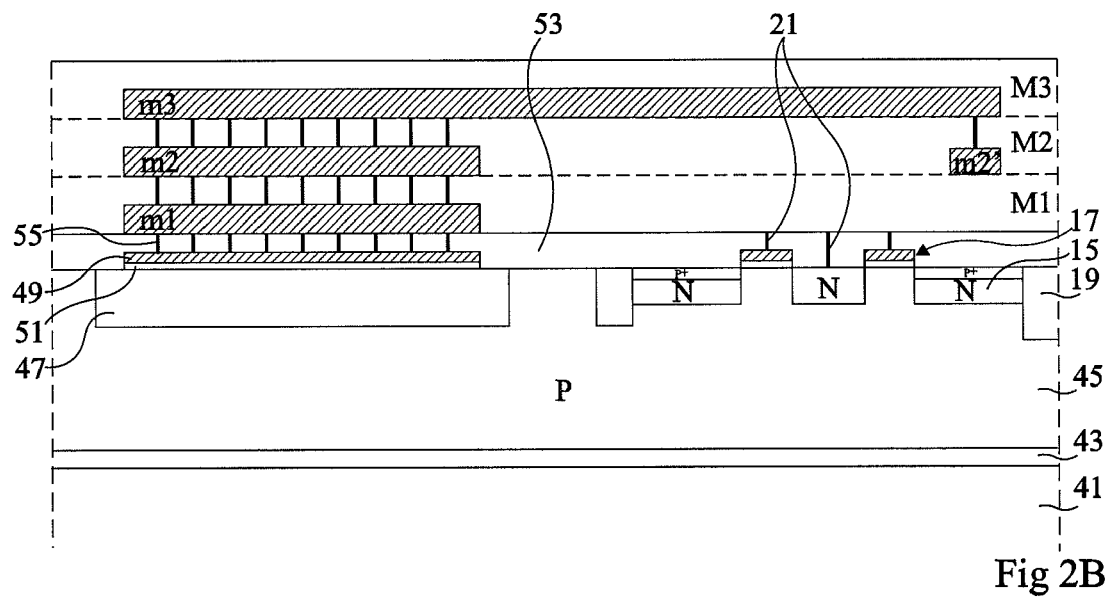

At the step illustrated in FIG. 2B, an interconnect stack has been formed on layer 53 of dielectric material. As an illustration, three interconnect levels M1, M2, and M3 are shown. It should be noted that, generally, more than three interconnect levels are formed in the interconnect stack. Each interconnect level M1, M2, and M3 comprises an assembly of metal tracks, for example, made of copper, and these tracks are insulated from one another by a dielectric material. The interconnect stack is formed by any known method and only a few metal tracks are shown as an illustration in the drawings. In particular, a stack of three metal layers m1, m2, and m3, respectively formed in interconnect levels M1, M2, and M3 have been shown at the level of the desired contact. Metal track m3 is connected to a circuit (not shown) associated with the image capture devices of the photodetection region via a metal track m2' formed in interconnect level M2. The different metal tracks are interconnected by means of metal vias formed in the dielectric material of the interconnect levels. The assembly comprising substrate 45 and the interconnect stack may have a thickness ranging between 3 and 6 μm.

Figure 2C:
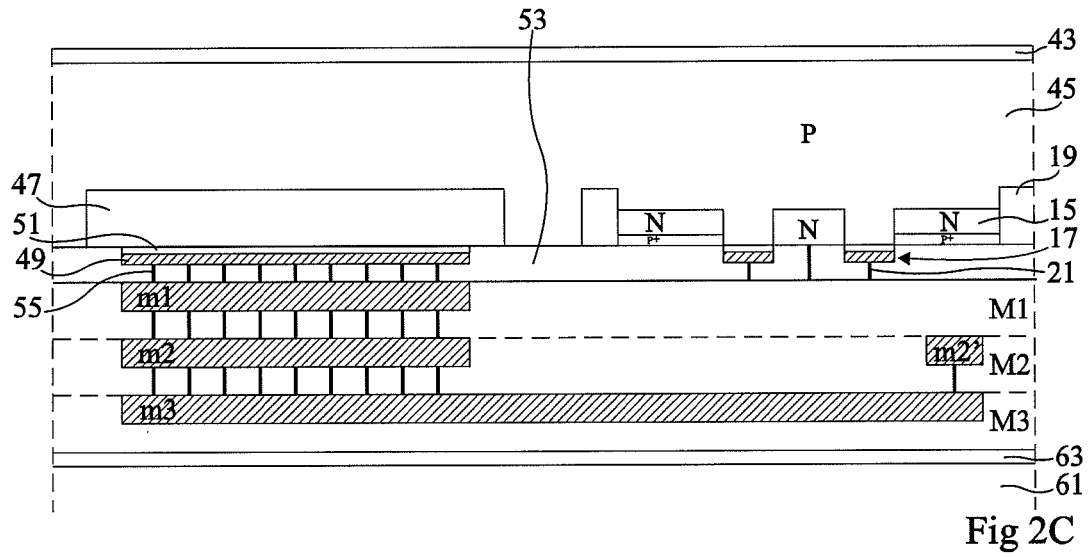

At the step illustrated in FIG. 2C, a semiconductor support 61 has been glued on the interconnect stack, by means of an intermediary layer 63, after which the structure has been turned over. As an example, support 61 may be a semiconductor wafer having a thickness ranging between approximately 400 and 700 μm. Support 41 has then been eliminated to expose the surface of insulating layer 43. The elimination of substrate 41 may be performed by any method known by those skilled in the art.

Figure 2D:
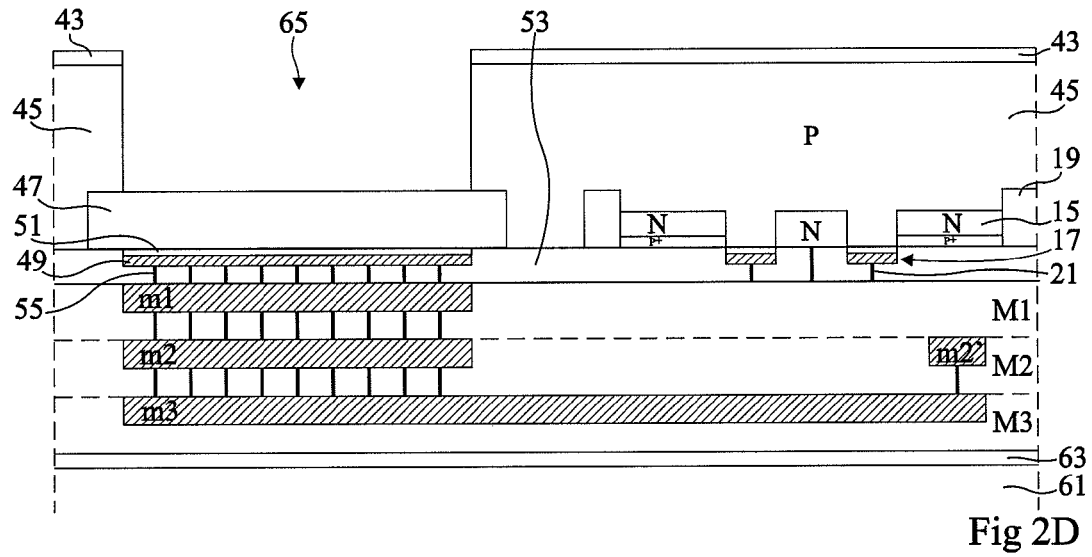

At the next step illustrated in FIG. 2D, an etching of layer 43 and of substrate 45 above insulating region 47 has been performed by means of an adapted mask. This etching forms an opening 65 stopping on insulating region 47. This etching will be performed by any known method enabling to etch layer 43, then silicon substrate 45, selectively with respect to the insulating material of region 47. As an example, opening 65 may have dimensions ranging between 30 and 100 μm. It should be noted that the etch stop function of the insulating region 47 is efficient due to the thickness of this region. Indeed, providing an etch stop function with a very thin insulating layer, for example the insulating layer 51, could damage this thin layer and portions situated below.

Figure 2E:
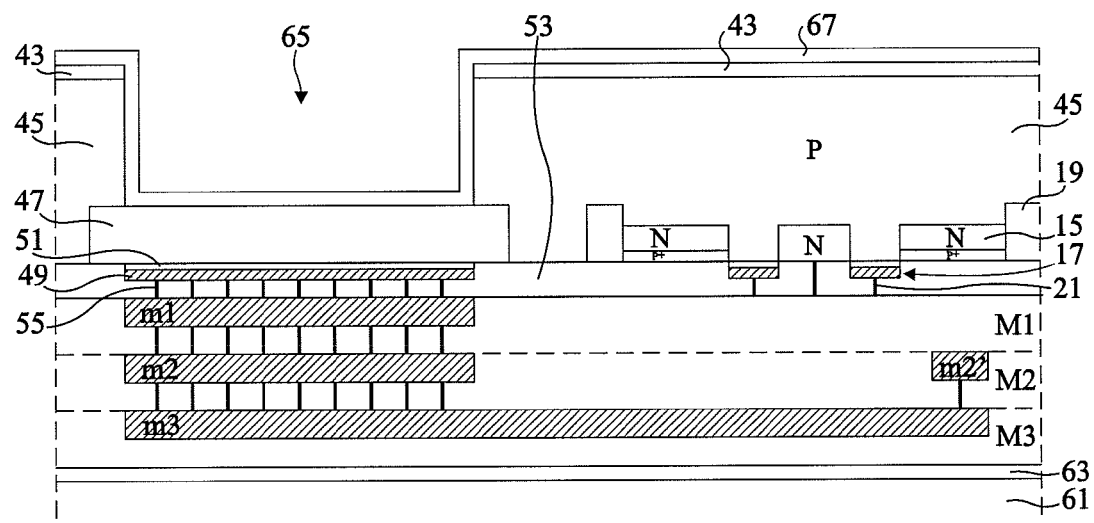

At the step illustrated in FIG. 2E, a thin insulating protection layer 67 has been deposited on the bottom and on the walls of opening 65 and on top of insulating layer 43. Thin insulating layer 67 aims at insulating the metal subsequently formed in opening 65 of semiconductor substrate 45. It also enables to electrically isolate the different metal contacts formed in substrate 45 from one another. As an example, layer 67 may be formed by plasma-enhanced chemical vapor deposition (PECVD) and it may be made of silicon oxide, silicon nitride, silicon oxynitride, or be formed of a multiple-layer silicon oxide—silicon nitride—silicon oxide (ONO) stack. Insulating layer 67 is also advantageously used as an antireflection layer above the image capture elements, and also as a passivation layer for the rear surface of the image sensor.

Figure 2F:
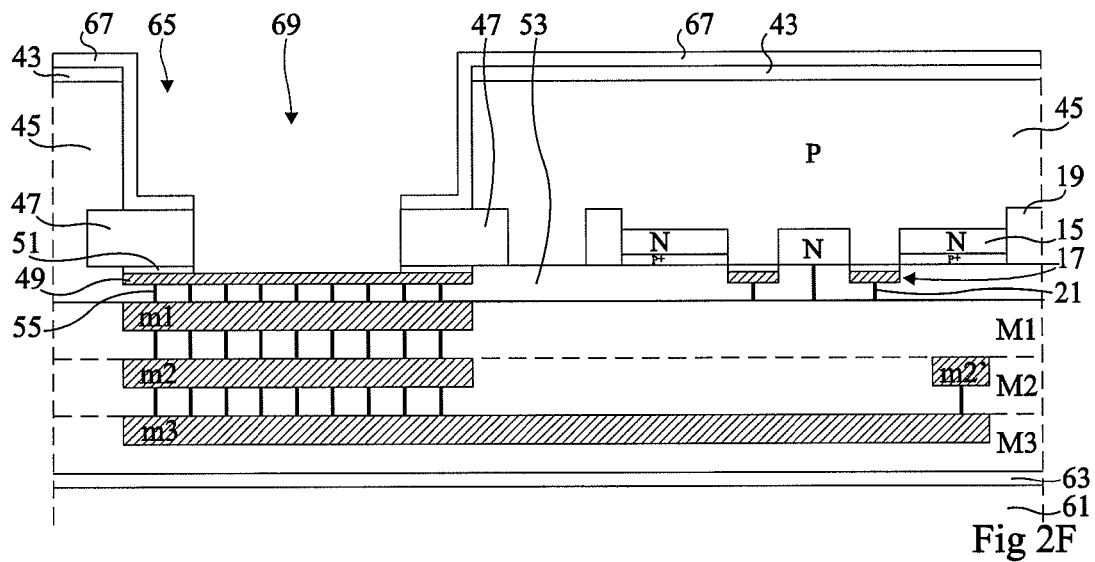

At the next step illustrated in FIG. 2F, insulating layer 67, insulating region 47, and thin insulating layer 51 have been etched in the bottom of opening 65, to form an opening 69 which stops on the doped polysilicon of conductive region 49. Opening 69 may be obtained by any type of etching enabling to selectively etch the insulating material of stack 67/47/51 with respect to the doped polysilicon of conductive region 49.

Figure 2G:
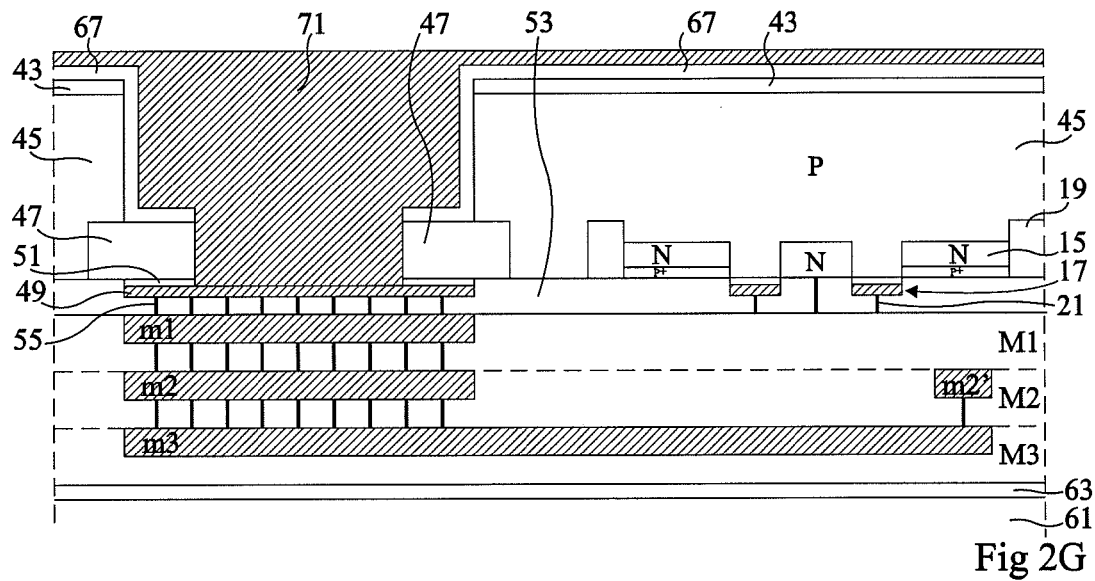

At the step illustrated in FIG. 2G, a thick layer of a metal 71 has been deposited on the structure. This deposition completely fills openings 65 and 69. The deposited metal preferably is aluminum, but it may also be made of any material conventionally used to form metal terminals.

Figure 2H:
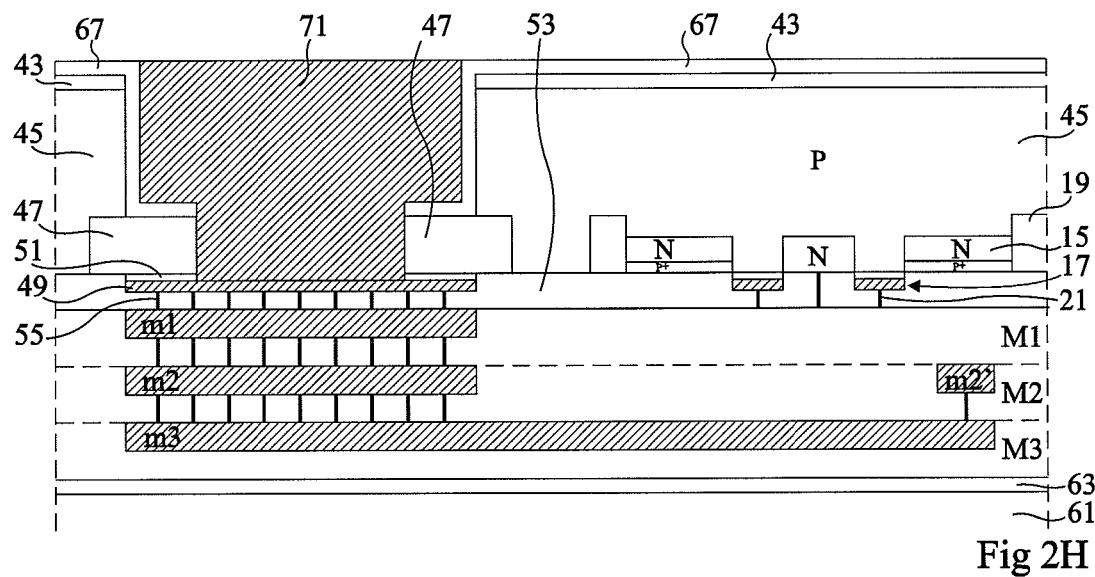

At the next step illustrated in FIG. 2H, the structure has been polished to eliminate metal 71 present above insulating layer 67 and to obtain a structure having a perfectly planar upper surface. As an example, this polishing may be a chem./mech. polishing (CMP). Metal 71 forms a metal terminal on which any adapted connection element may be connected.

Thus, advantageously, the method according to an embodiment only requires two masking and etch steps. Further, the elements for establishing an electric contact between metal 71 and metal track m1 (conductive region 49 and metal vias 55), as well as insulating region 47, are formed at the same time as conventional photodetection elements of image sensors. Thus, the method does not need any additional steps with respect to a conventional method.

Further, the second etching (enabling to form opening 69) stops on the doped polysilicon of conductive region 49, which enables to avoid any problem of corrosion of the metal tracks formed in the interconnect stack since they are never in contact with an etching agent or with air. The electric contact between aluminum 71 and metal track m1 of interconnect level M1 is performed via the doped polysilicon of conductive region 49 and conductive vias 55. It should be noted that the electric contact between aluminum 71 and the polysilicon is of good quality, and that the large number of conductive vias 55 between polysilicon 49 and track m1 enables a good electric connection between these regions.

Further, the polishing step of FIG. 2H enables to obtain a structure having a planar upper surface. Thus, depositions of colored resins may be performed with no contamination of the contact area by the resin.

Further, this method enables placing the contact terminals as close as possible to the image detection matrix and thus to decrease the chip size.

Specific embodiments of the present invention have been described. Different variations and modifications will occur to those skilled in the art. In particular, it should be noted that the various depositions and etchings described herein may be performed by any method known by those skilled in the art.

As a variation, insulation trenches 19 may be formed by any method different from the method for forming insulating region 47. It may, for example, be provided to form very deep trenches 19, for example, filled with a conductive metal insulated from semiconductor substrate 45 and biased to a reference voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, on a surface of a thinned-down semiconductor substrate, a contact connected to a metal track of an interconnect stack formed on the opposite surface of the thinned-down substrate, comprising:

forming, on a side of a first surface of a semiconductor substrate, an insulating region penetrating into the substrate and forming, on the first surface of the semiconductor substrate, a conductive region of polysilicon coated with an insulating layer crossed by conductive vias, said conductive vias connecting a metal track of the interconnect stack to said conductive region, said conductive region being formed at the same time as gates of MOS transistors;

gluing the external surface of the interconnect stack on a support and thinning down the substrate; and etching the external surface of the thinned-down substrate and stopping on said insulating region; etching said insulating region and stopping on said conductive region; and filling the etched opening with a metal.

2. The method of claim 1, further comprising a method for forming photodetection elements associated with the MOS transistors, on the side of the first surface of the semiconductor substrate, said photodetection elements being intended to be lit from the external surface of the thinned-down substrate.

3. The method of claim 2, wherein the insulating region is formed at the same time as insulation trenches formed around the photodetection elements.

4. The method of claim 1, wherein the conductive vias are formed at the same time as second conductive vias contacting the gates of the MOS transistors.

5. The method of claim 1, further comprising a step of forming a protection layer between the step of etching the external surface of the thinned-down substrate and the step of etching the insulating region.

6. The method of claim 5, wherein the protection layer is made of silicon oxide, of silicon nitride, of silicon oxynitride, or is formed of a multiple-layer silicon oxide—silicon nitride—silicon oxide stack.

7. The method of claim 5, wherein the protection layer is formed so as to provide antireflection properties for the photodetection elements.

8. The method of claim 1, wherein the filling of the etched opening with metal comprises a step of metal deposition on the structure and a step of polishing of the structure enabling to remove the metal which is not in the opening.

9. The method of claim 1, wherein the conductive region extends over a majority of the insulating region and the polysilicon is doped.

10. The method of claim 1, further comprising forming a thin insulating layer between the insulating region and conductive region.

11. The method of claim 10, wherein the thin insulating layer is formed at a same time as gate insulators for the MOS transistors.

12. A method for forming a contact to an interconnect stack from an opposite side of a first semiconductor substrate, the method comprising acts of:
    forming, at a first surface on a first side of the first semiconductor substrate, an insulating region;
    forming a conductive layer proximal to the insulating region and extending across a majority of the insulating region, wherein the conductive layer is formed simultaneously with forming gates of MOS transistors on the first side of the first semiconductor substrate;
    forming, proximal to the conductive layer, an interconnect stack comprising insulating material and first conductive vias crossing the insulating material and connecting at least one metal track of the interconnect stack to the conductive layer;
    bonding a second substrate to the first side of the first semiconductor substrate; and
    thinning the first semiconductor substrate.

13. The method of claim 12, wherein the insulating region is formed at the same time as insulation trenches in the first semiconductor substrate near the MOS transistors.

14. The method of claim 12, wherein the conductive layer comprises doped polysilicon.

15. The method of claim 12, further comprising forming a thin insulating layer between the insulating region and conductive layer.

16. The method of claim 15, wherein the thin insulating layer is formed at a same time as gate insulators for the MOS transistors.

17. The method of claim 12, wherein the first conductive vias are formed simultaneously with the forming of second conductive vias contacting at least one gate of the MOS transistors.

18. The method of claim 12, further comprising forming photodetection elements coupled to the MOS transistors on the first side of the first semiconductor substrate, wherein the photodetection elements are to be illuminated from a second side of the first semiconductor substrate opposite the first side.

19. The method of claim 18, wherein at least one of the photodetection elements is integrated with at least one of the MOS transistors.

20. The method of claim 12, further comprising:
    etching an opening in a second side of the first semiconductor substrate opposite the first side;
    stopping the etching on the insulating region;
    further etching the opening in the insulating region;
    stopping the further etching on the conductive region; and
    depositing a metal in the etched opening.

21. The method of claim 20, further comprising forming a protection layer on the second side of the first semiconductor substrate between the acts of etching an opening in a second side of the first semiconductor substrate and further etching the opening in the insulating region.

22. The method of claim 21, wherein the protection layer is formed so as to provide antireflection properties for the photodetection elements.

23. The method of claim 21, wherein the protection layer comprises silicon oxide, silicon nitride, silicon oxynitride, or is formed of a multiple-layer silicon oxide—silicon nitride—silicon oxide stack.

24. The method of claim 21, further comprising polishing the second side of the first substrate to remove metal that is not in the etched opening.

* * * * *